United States Patent
Itou et al.

(10) Patent No.: US 11,305,311 B2
(45) Date of Patent: Apr. 19, 2022

(54) COATING METHOD, COATING APPARATUS AND METHOD FOR MANUFACTURING COMPONENT

(71) Applicant: Panasonic Intellectual Property Management Co., Ltd., Osaka (JP)

(72) Inventors: Mitsumi Itou, Kyoto (JP); Hiroshi Ebihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/130,456

(22) Filed: Dec. 22, 2020

(65) Prior Publication Data

US 2021/0107029 A1    Apr. 15, 2021

Related U.S. Application Data

(62) Division of application No. 16/274,176, filed on Feb. 12, 2019, now Pat. No. 10,906,061.

(30) Foreign Application Priority Data

Feb. 26, 2018    (JP) .................................. 2018-031444

(51) Int. Cl.
*B05D 1/28*    (2006.01)
*H01L 23/00*    (2006.01)
(Continued)

(52) U.S. Cl.
CPC .......... *B05C 11/1034* (2013.01); *B05C 1/025* (2013.01); *B05C 5/0225* (2013.01);
(Continued)

(58) Field of Classification Search
CPC ............................. B05D 1/28; B05D 2505/00
See application file for complete search history.

(56) References Cited

U.S. PATENT DOCUMENTS

| 3,329,964 A | 7/1967 | Mutschler |
| 4,904,499 A | 2/1990 | Shimizu |
| (Continued) | | |

FOREIGN PATENT DOCUMENTS

| CN | 105828958 | 8/2016 |
| JP | 4-105355 | 4/1992 |
| (Continued) | | |

OTHER PUBLICATIONS

English Translation of Chinese Search Report dated Jun. 9, 2021 in corresponding Chinese Patent Application No. 201910135817.2.

*Primary Examiner* — Dah-Wei D. Yuan
*Assistant Examiner* — Kristen A Dagenais-Englehart
(74) *Attorney, Agent, or Firm* — Wenderoth, Lind & Ponack, L.L.P.

(57) ABSTRACT

The present disclosure provides a coating method for suppressing variations in a coating amount, a coating apparatus and a method for manufacturing a component. A coating method is employed, which includes: discharging a coating needle adhering to an adhesive from a nozzle; separating the adhesive into the tip of the coating needle and the nozzle; and adhering the adhesive to a first member. A coating apparatus is employed, which includes: a nozzle which holds the adhesive; a coating needle which is discharged from the nozzle in a state where the adhesive is adhered to (Continued)

the tip; and a control unit which controls moving speed of the coating needle to separate the adhesive into the tip of the coating needle and the nozzle.

4 Claims, 14 Drawing Sheets

(51) Int. Cl.
    *B05C 11/10*     (2006.01)
    *B05C 1/02*     (2006.01)
    *H01L 21/50*     (2006.01)
    *H01L 21/67*     (2006.01)
    *B05C 5/02*     (2006.01)
    *H01L 27/146*     (2006.01)

(52) U.S. Cl.
    CPC ............... *B05D 1/28* (2013.01); *H01L 21/50* (2013.01); *H01L 21/6715* (2013.01); *H01L 24/27* (2013.01); *B05D 2502/00* (2013.01); *H01L 27/14618* (2013.01); *H01L 2224/27318* (2013.01); *H01L 2224/8385* (2013.01); *H01L 2924/163* (2013.01); *H01L 2924/16195* (2013.01); *H01L 2924/16235* (2013.01)

(56) References Cited

U.S. PATENT DOCUMENTS

| | | | |
|---|---|---|---|
| 4,916,805 | A | 4/1990 | Ellrich |
| 6,296,702 | B1 * | 10/2001 | Bryning ............... B01J 19/0046 118/410 |
| 7,887,874 | B2 * | 2/2011 | Weiss ................. B05C 11/1034 700/19 |
| 9,339,839 | B2 | 5/2016 | Fliess et al. |
| 2010/0080912 | A1 | 4/2010 | Koyama et al. |
| 2014/0291358 | A1 | 10/2014 | Fliess et al. |
| 2018/0252512 | A1 | 9/2018 | Ohba |

FOREIGN PATENT DOCUMENTS

| | | |
|---|---|---|
| JP | 2010-087320 | 4/2010 |
| JP | 2014-525831 | 10/2014 |
| JP | 2016-021736 | 2/2016 |
| JP | 2017-96916 | 6/2017 |
| JP | 2018-20325 | 2/2018 |

* cited by examiner

COATING METHOD, COATING APPARATUS AND METHOD FOR MANUFACTURING COMPONENT

TECHNICAL FIELD

The present disclosure relates to a coating method, a coating apparatus and a method for manufacturing a component. Particularly, the present disclosure relates to a coating method using an adhesive, a coating apparatus and a method for manufacturing a component.

BACKGROUND

In the related art, in order to protect a pixel portion of an image sensor, a cover glass is attached.

FIG. 1 is a perspective view of a state when a cover glass of a protective member 6 is attached to a semiconductor element 4 of an image sensor. In order to attach the protective member 6 to the semiconductor element 4, initially, it is necessary to apply an adhesive 5 to a surface of the semiconductor element 4. FIG. 2 is a view showing an apparatus for applying the adhesive 5. A coating needle 1 is inserted into a nozzle 2 which is filled with the adhesive 5.

FIG. 3 is a view of a state when the adhesive 5 is applied to the semiconductor element 4. The coating needle 1 is moved to a bottom and comes out from the nozzle 2. An adhesive 5e is adhered to a tip of the coating needle 1, and the adhesive 5e is transferred to the semiconductor element 4 by further lowering the coating needle 1. The coating needle 1 is operated at a constant speed and lowered to a position where the adhesive 5e is transferred to the semiconductor element 4. When transferring, the adhesive 5e on the tip of the coating needle 1 and an adhesive 5f adhering to a lateral surface 1f near the tip of the coating needle 1 are transferred simultaneously.

After the adhesive 5 is applied, the protective member 6 approaches the semiconductor element 4 as shown in FIG. 1. Expanse of the adhesive 5 at this time is illustrated in FIGS. 4A to 4C. FIGS. 4A to 4C are plan views illustrating aging variations when the protective member 6 is attached to the semiconductor element 4.

The adhesive 5 is spread in a concentric circle shape in the order of FIG. 4A to FIG. 4C. Since the protective member 6 is transparent, the adhesive 5 can be seen.

In order to adhere firmly, it is necessary to forward the adhesive 5 to four corners of the protective member 6. Therefore, since it is necessary to make the adhesive 5 protrude from an external form of the semiconductor element 4, in consideration of variations in the coating amount, it is necessary to apply the adhesive 5 in a large amount.

Finally, FIG. 5 is a side view illustrating a finished product when the coating amount of the adhesive 5 is too large. An adhesive dripping 11 to the lateral surface of the semiconductor element 4 and an adhesive creeping-up 10 to the cover glass occur. The adhesive dripping 11 and the adhesive creeping-up 10 occur more often on a central part of a side of the protective member 6. The adhesive creeping-up 10 comes into a state in which the central part of the side becomes most prevalent, and decreases in a direction of both sides corners of the protective member 6. The adhesive dripping 11 comes into a state in which the central part of the side of the semiconductor element 4 becomes most prevalent, and decreases in a direction of both sides corners of the semiconductor element 4. When these adhere to the protective member 6, marks appear due to the adhesive 5 spread in a concentric circle shape, there is a risk of low quality caused by unnecessary adhesive transferring of the next step. If coating in a large amount, in consideration of the variations in the coating amount, it is highly possible that low quality finished products may be mass produced. Therefore, it is necessary to suppress the variations in the coating amount and not to increase the coating amount of the adhesive as much as possible.

There is a method of JP-A-2016-21736 (Patent Literature 1) as a method for controlling the coating amount with high accuracy. In JP-A-2016-21736, the adhesive is coated on one side of the semiconductor element and is spread to other sides.

SUMMARY

However, JP-A-2016-21736 is not a method for suppressing variations in a coating amount and extra steps are needed.

The present disclosure solves the conventional problems and provides a coating method for suppressing variations in the coating amount, a coating apparatus and a component manufacturing method.

In order to solve the problem as described above, a coating method is employed, in which the coating method including the following steps: a discharge step in which a coating needle adhering an adhesive comes out from a nozzle; a separating step in which the adhesive is separated onto the tip of the coating needle and the nozzle; and a adhering step that the adhesive adheres to a first member.

A component manufacturing method is employed, in which the manufacturing method including the following steps: a discharge step in which a coating needle adhering an adhesive comes out from a nozzle; a separating step that the adhesive is separated onto the tip of the coating needle and the nozzle; a adhering step in which the adhesive adheres to a first member; and a bonding step in which a second member is bonded from the adhesive on the first member.

A coating apparatus is employed, in which the coating apparatus including: a nozzle holding an adhesive; a coating needle coming out from the nozzle in a state that adhesive is adhered to the tip; a control unit that can control separation of the adhesive from the tip of the coating needle and the nozzle by controlling a moving speed of the coating needle.

According to the transferring coating apparatus of the present disclosure, since coating amount variations of a minute point of transferring can be reduced, it is possible to coat accurately the coating amount which can firmly fill up four corners under the bonding member and to improve bonding reliability between a semiconductor chip and a bonding member. In addition, amount extruding from bonding members becomes fewer and influence of next steps will be eliminated.

DESCRIPTION OF EMBODIMENTS

Embodiments of the present disclosure will be described with reference to the drawings.

Structure

Figure 6A:
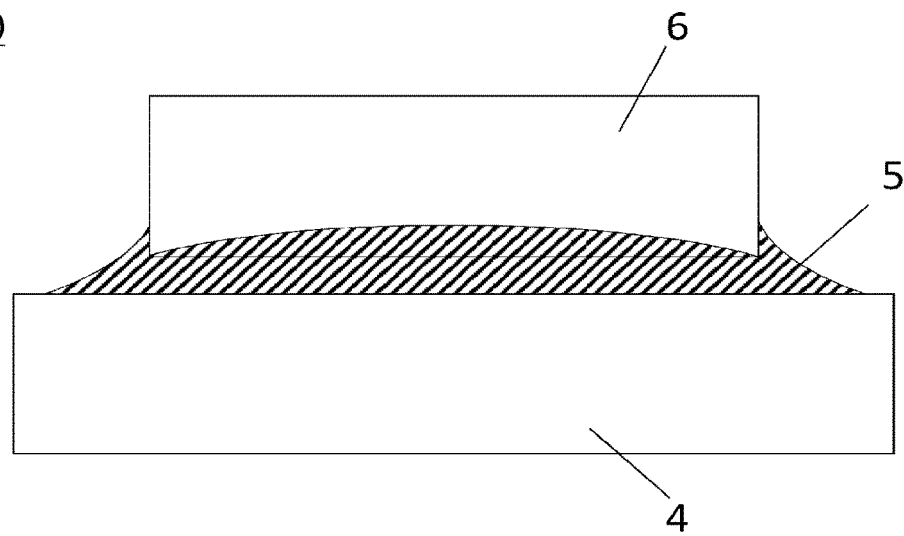
FIG. 6A is a front view of amounting structure of an embodiment.
Figure 6B:
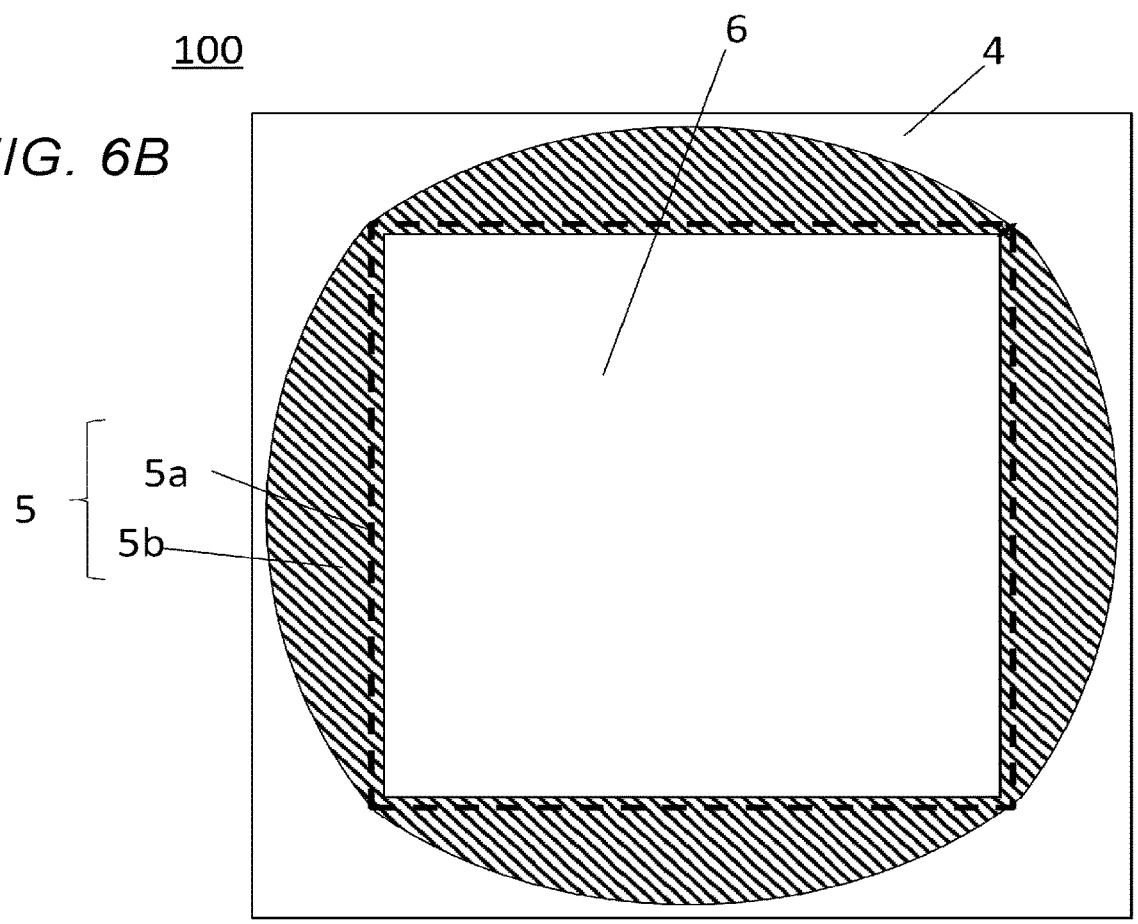
FIG. 6B is a plan view of the mounting structure of the embodiment.
Figure 7:
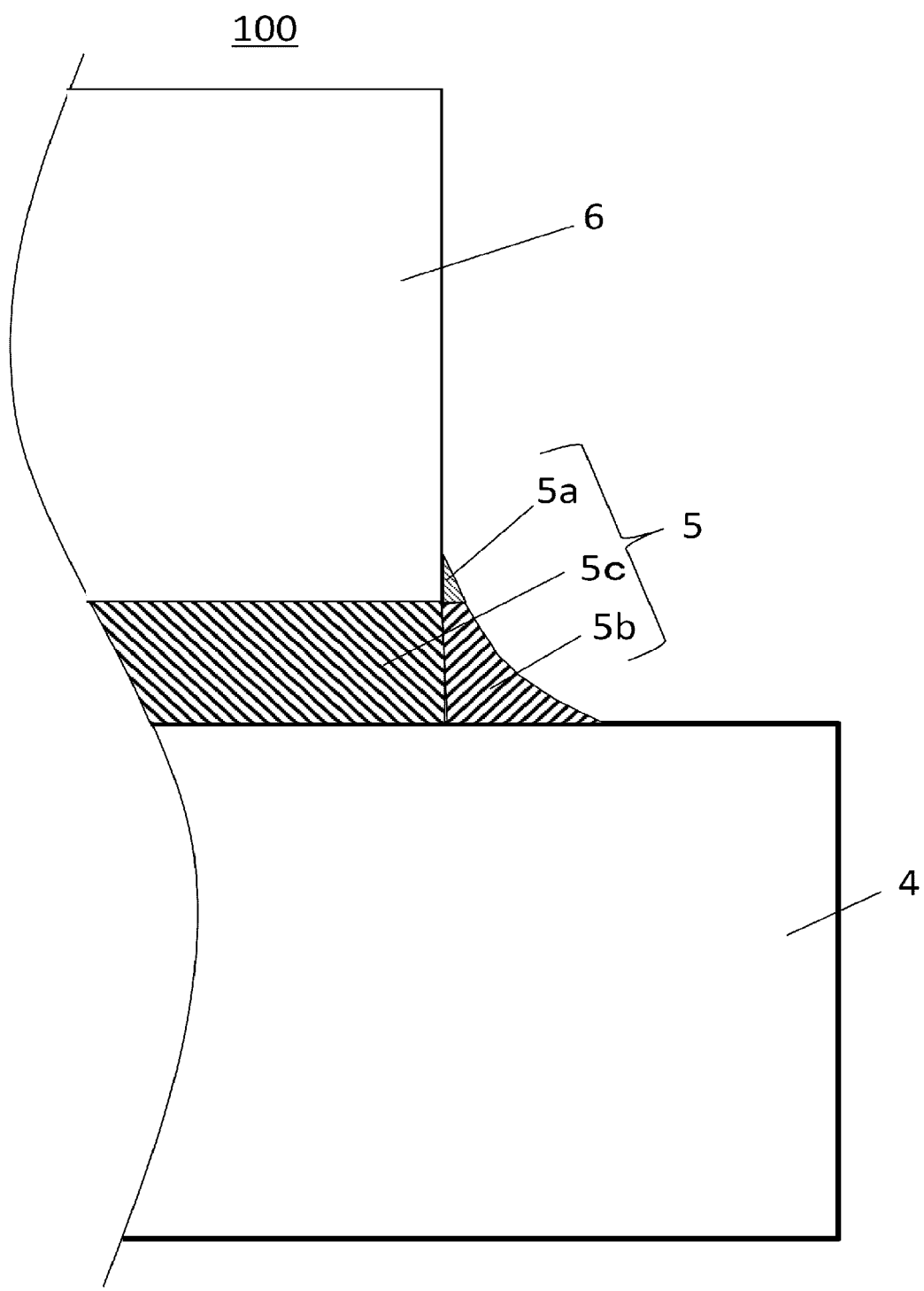
FIG. 7 is an enlarged side view of the semiconductor mounting structure of the embodiment.

FIG. 6A is a side view of a semiconductor mounting structure 100 of an embodiment, and FIG. 6B is a plan view of the semiconductor mounting structure 100 of the embodiment. FIG. 7 is an enlarged side view of the semiconductor mounting structure 100 of the embodiment and illustrates an end portion of an adhesive 5. In FIG. 7, a protective member 6 adheres to a semiconductor element 4 by the adhesive 5.

The semiconductor element 4 is a functional element such as an image sensor. In this example, the semiconductor element 4 is a square of about 1 mm×1 mm in a plan view and the overall shape thereof is a rectangular parallelepiped.

In this case, the protective member 6 is a cover glass for protecting the semiconductor element 4. The size of the protective member 6 is a square less than 1 mm×1 mm and is smaller than the semiconductor element 4 in a plan view.

The adhesive 5 is for making the semiconductor element 4 adhere to the protective member 6.

The adhesive 5 includes a center portion 5c between the semiconductor element 4 and the protective member 6, a periphery portion 5b located on the periphery of the center portion 5c and a lateral surface portion 5a creeping up to the lateral surface of the quadrate protective member 6. Further, the center portion 5c is only located on the bottom (bonding surface) of the protective member 6. The lateral surface portion 5a is located on the top of the periphery portion 5b. The lateral surface portion 5a and the periphery portion 5b change greatly depending on variations in the coating amount of the adhesive 5. Since an amount that can completely fill at least the center portion 5c needs to be served as a minimum coating amount, it is necessary to aim for more than an amount that can be minimum depending on the variations in the coating amount. As a result, when variations in the coating amount are large, there is an amount that is more than the lateral surface portion 5a and the periphery portion 5b need, which may cause an adhesive dripping 11 to the lateral surface of the semiconductor element 4.

The semiconductor mounting structure 100 of the embodiment can reduce the variations in the coating amount of adhesive 5 and can reduce the occurrence of the adhesive dripping 11 to the lateral surface of the semiconductor element 4.

This structure can be realized by the following manufacturing method.

Manufacturing Method

In a related art, a method for applying the adhesive 5 by controlling a coating needle 1 from starting lowering to transferring at a constant speed is used. Here, a region of the constant speed excludes regions of low speed at initial stage when the coating needle 1 starts to move and an end stage when the coating needle 1 is stopped.

In an embodiment, variations in the coating amount of adhesive 5 can be reduced by controlling a speed of a lowering operation of the coating needle 1.

Steps

Figure 12A:
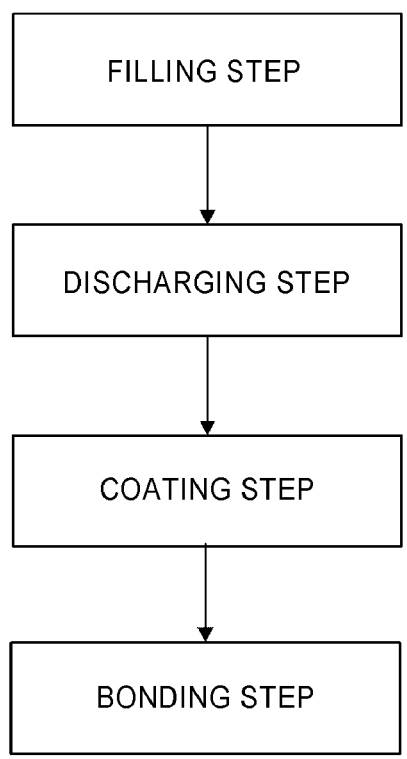
FIG. 12A is a view illustrating an operation flow in a related adhesive coating.
Figure 12B:
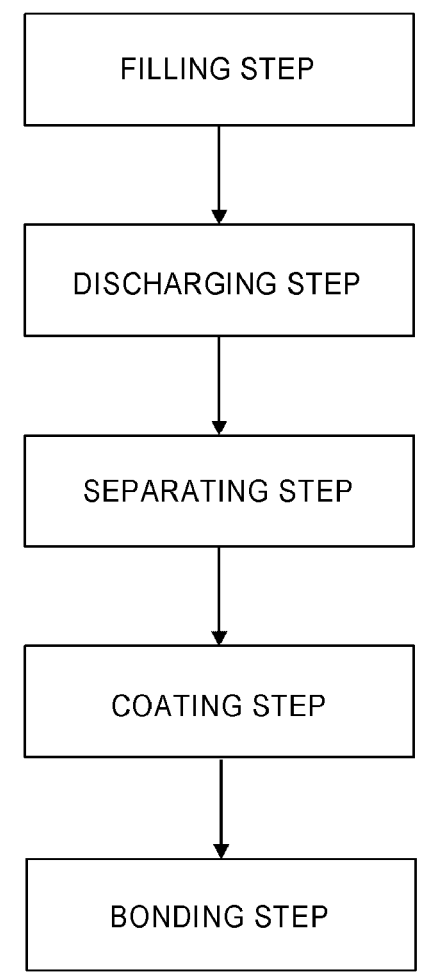
FIG. 12B is a view illustrating an operation flow in the adhesive coating of the embodiment.

FIG. 12A shows a related adhesive coating operation, and FIG. 12B shows an adhesive coating operation of the embodiment. Compared to the related method, in the embodiment, the moving speed of the coating needle 1 is controlled to be changed and temporarily stopped.

Then, an operation of temporarily stopping the operation of lowering the coating needle 1 is used and steps until applying the adhesive 5 to the semiconductor element 4 will be described.

(1) Filling Step

Figure 1:
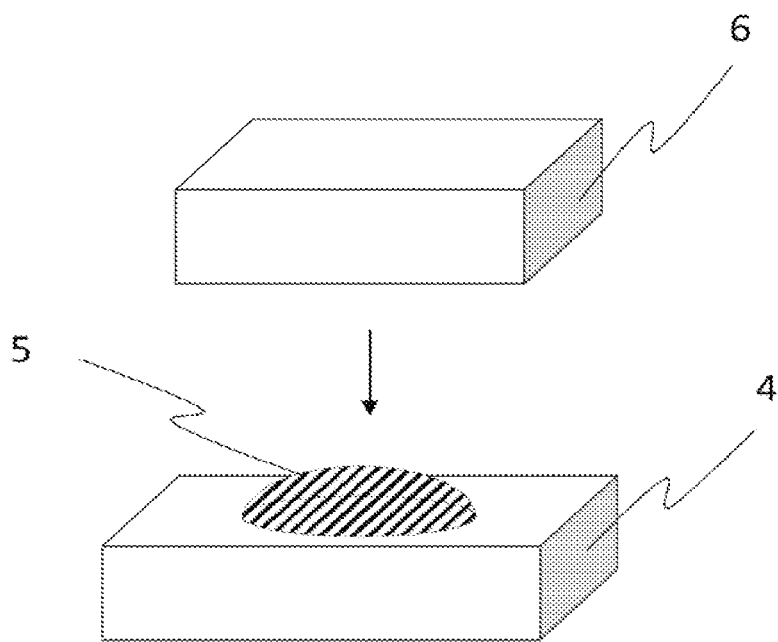
FIG. 1 is a perspective view when a cover glass is attached to a related semiconductor element.
Figure 2:
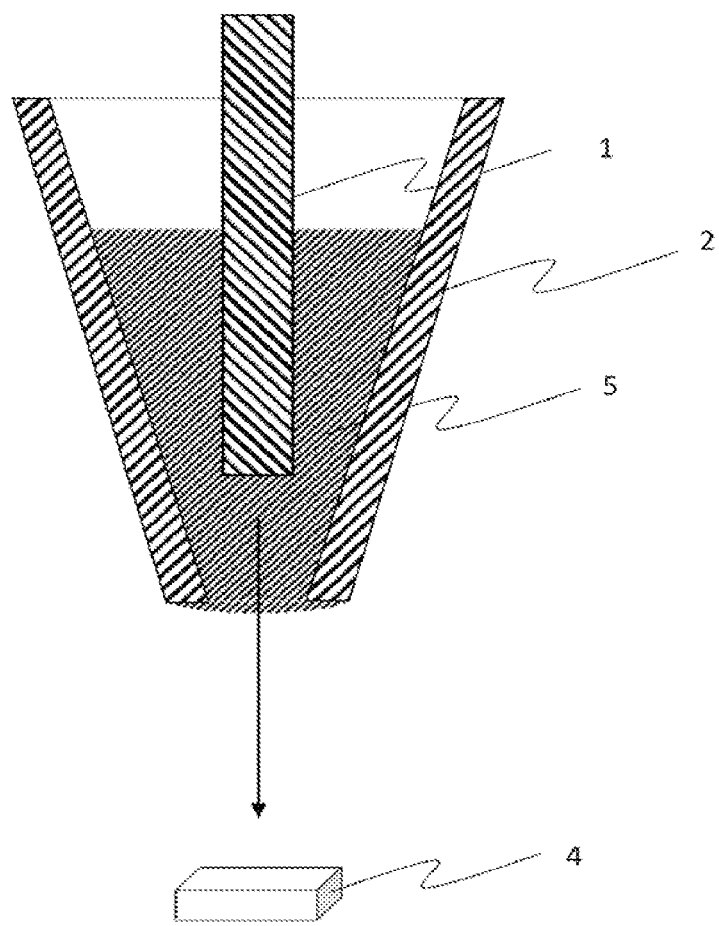
FIG. 2 is a view illustrating adhesive coating by means of related adhesive coating needle.

Firstly, the adhesive 5 is filled into a nozzle 2 and is held. In this example, an acrylic resin type adhesive having a low viscosity of about 1000 mPa·s was used as the adhesive 5. FIG. 2 is a view of an apparatus applied with the adhesive 5. The coating needle 1 is inserted into the nozzle 2 which is filled with the adhesive 5. If the adhesive 5 is already held to the nozzle 2, the filling step is not necessary.

(2) Discharging Step

From a state of FIG. 2, the coating needle 1 is moved downward and the coating needle 1 is discharged to the outside of the nozzle 2.

(3) Separating Step

Figure 8:
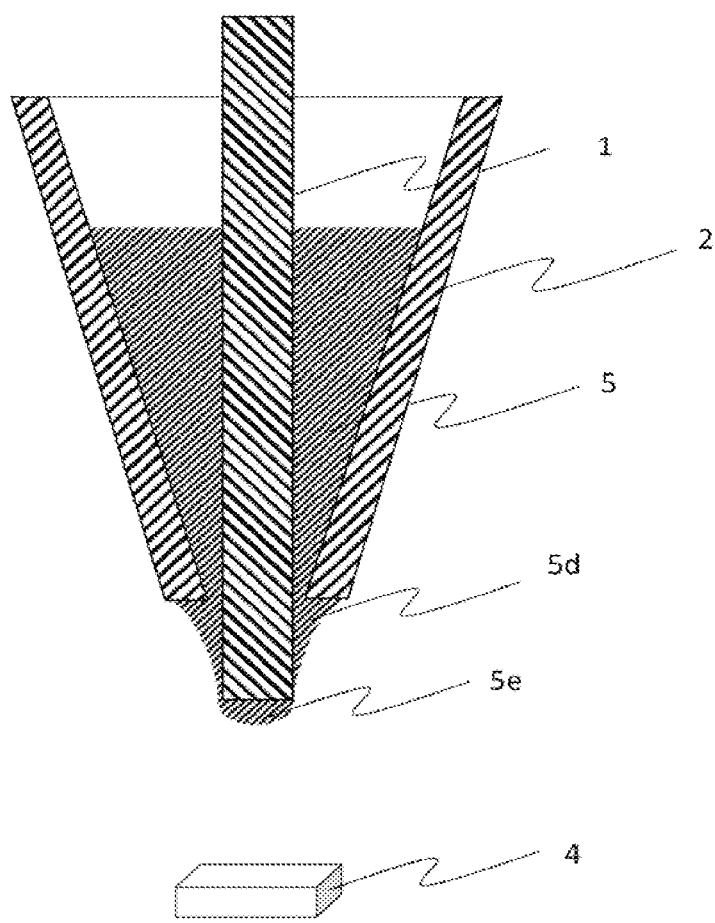
FIG. 8 is a view illustrating a relationship between the adhesive and the coating needle which is stopped in the adhesive coating of the embodiment.

After the discharge step, a constant moving speed of the coating needle 1 is changed and stopped halfway. FIG. 8 is a view illustrating a relationship between the adhesive 5 and the coating needle 1 which is stopped halfway. The coating needle 1 is moved in a downward direction and is temporarily stopped when the coating needle 1 protrudes a constant distance from the nozzle 2. The adhesive 5 extruded from the nozzle 2 is separated into an adhesive 5e adhering to a tip of the coating needle 1 and an adhesive 5d adhering to a lateral surface of the coating needle 1. The adhesive 5 is separated by stopping. Further, although the adhesive 5 can be separated even if the coating needle 1 is moved at the constant speed, the position of separation is almost not changed.

At this time, the coating needle 1 is stopped when protruding 1 mm from the tip of the nozzle 2. The length of the coating needle 1 protruding from the tip of the nozzle 2 needs to be changed according to the type of the adhesive 5, the outer diameter and the inner diameter of the nozzle 2, and the outer diameter of the coating needle 1.

Figure 9:
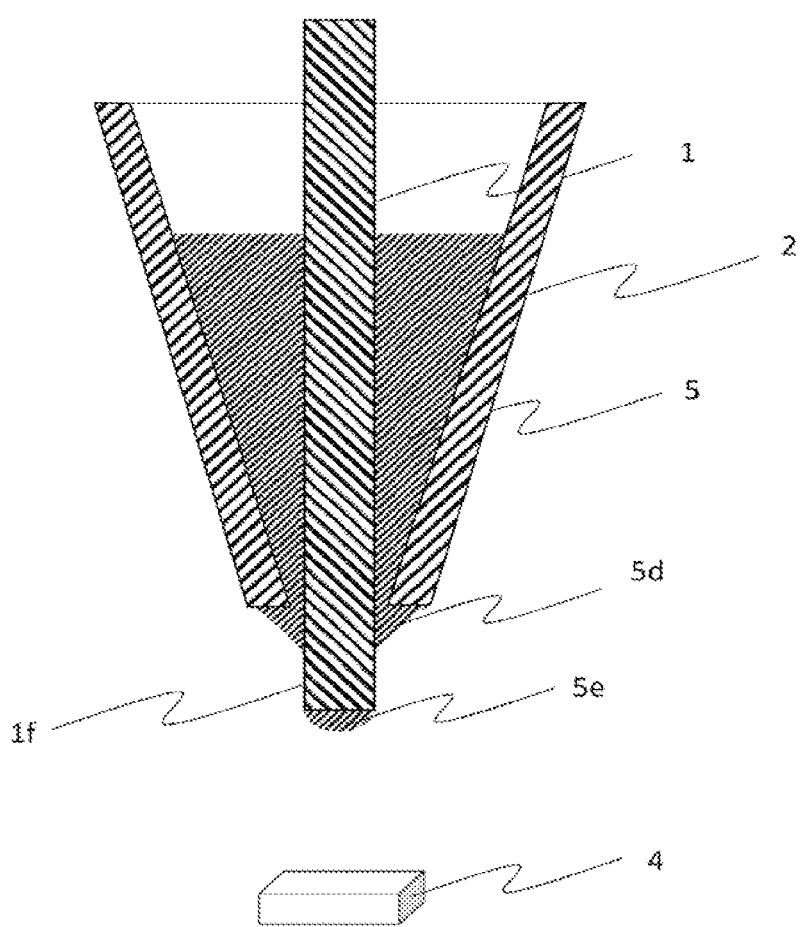
FIG. 9 is a view illustrating a relationship between the adhesive and the coating needle after the stop in the adhesive coating of the embodiment.

FIG. 9 is a view illustrating a relationship between the adhesive 5 and the coating needle 1 after the stop in the adhesive coating of the embodiment. FIG. 9 shows a state 1 second later after the coating needle 1 is stopped. The adhesive 5e adhering to a tip surface (a bottom surface) of the coating needle 1 is same as that shown in FIG. 8 (the coating needle 1 is held as in FIG. 8), but the shape of the adhesive 5d adhering to the lateral surface of the coating needle 1 is different. The adhesive 5d adhering to the lateral surface of the coating needle 1 is changed by being separated and pulled back to the nozzle 2 by a repellent force extruded to the coating needle 1 due to viscosity of the adhesive 5. As a result, the adhesive 5d does not adhere to a lateral surface if near the tip of the coating needle 1.

(4) Coating Step

Figure 10:
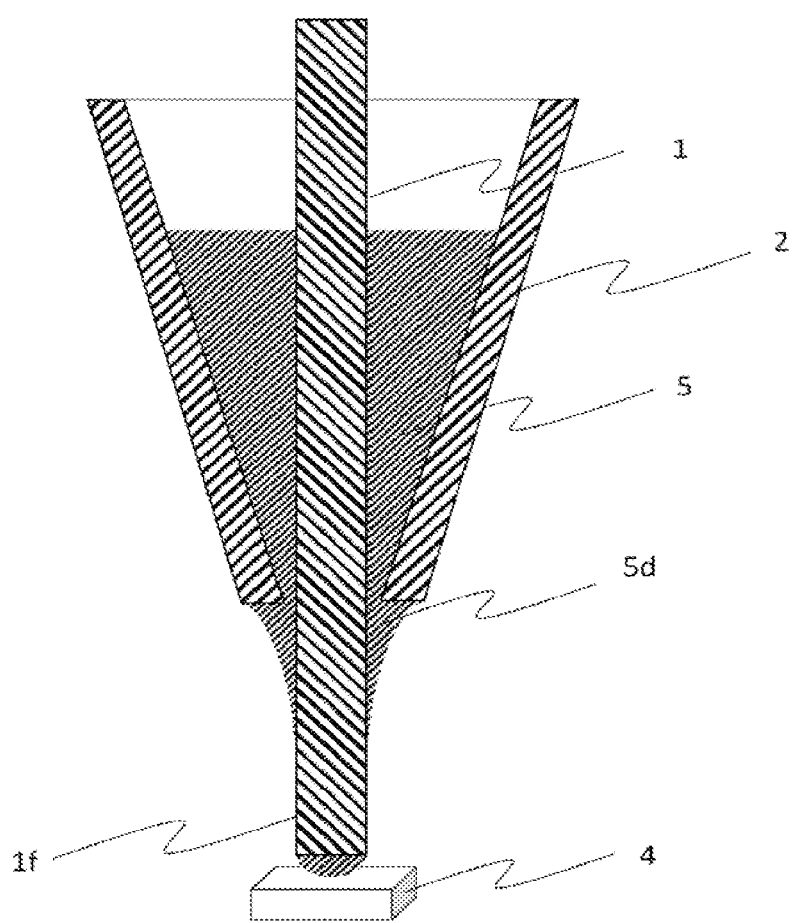
FIG. 10 is a view illustrating a relationship between the adhesive and the coating needle which is lowered again in the adhesive coating of the embodiment.

After the separating step, the coating needle 1 is moved again. FIG. 10 is a view illustrating a relationship between the adhesive and the coating needle 1 which is lowered again in the adhesive coating of the embodiment. Even if the coating needle 1 is lowered again, the operation is continued in a state in which the adhesive 5d does not adhere to the lateral surface if near the tip of the coating needle 1.

Figure 11:
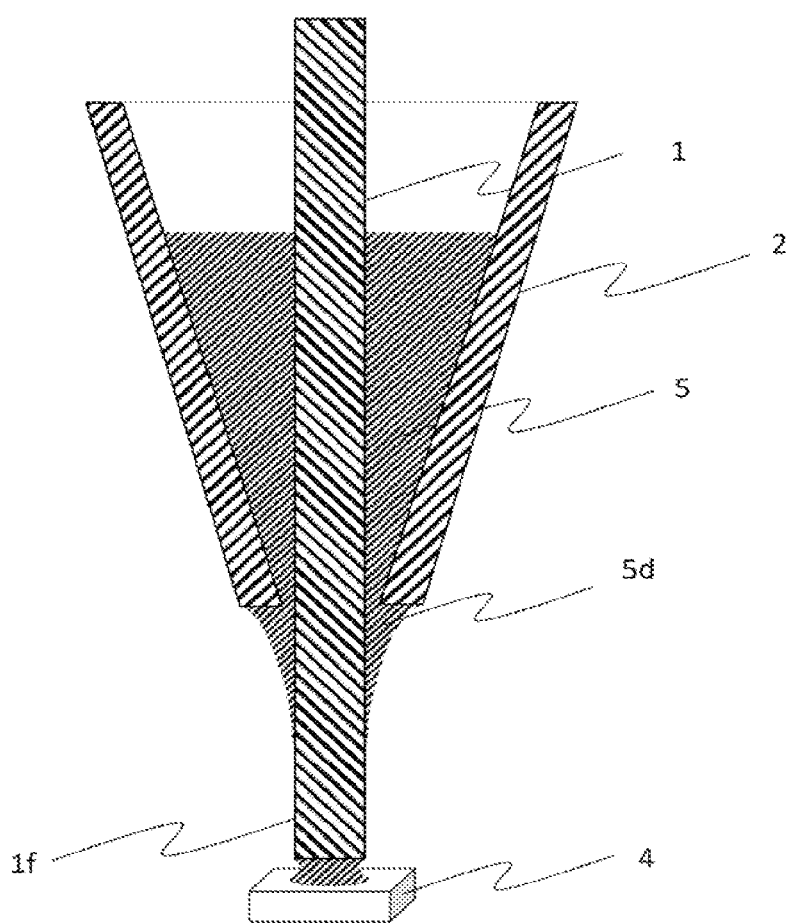
FIG. 11 is a view illustrating a relationship between the adhesive and the coating needle which is transferring in the adhesive coating of the embodiment.

FIG. 11 is a view illustrating a relationship between the adhesive 5 and the coating needle 1 which is transferring in the adhesive coating of the embodiment. In the adhesive coating to the semiconductor element 4, only the adhesive at the tip of the coating needle 1 is transferred. Since the adhesive 5d adhering to the lateral surface of the coating needle 1 is not subjected to transfer, the variations of the amount of the coated adhesive 5 is stable with little variation.

Time of the temporary stop is preferably in a range of 0.5 second to 5 seconds. Although the time can be longer, when considering productivity, 5 seconds or less are preferable.

When a place to stop, a place to reduce the speed of the coating needle 1, or a place of the separating step is 1 mm to 2 mm and less than 3 mm away from the nozzle 2. If the distance from the nozzle 2 is too long (longer than 3 mm), the adhesive 5 which cannot be drawn in and out of a nozzle 2 side stays on a side of the coating needle 1, and the coating amount will not be stable.

Figure 14A:
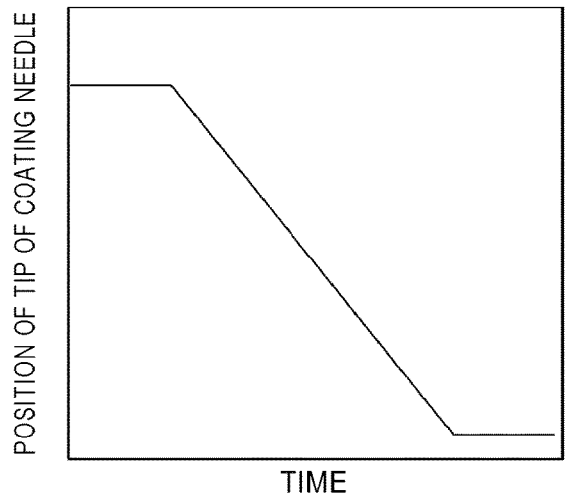
FIG. 14A is a view illustrating a relationship between time and a position of a tip of the related coating needle.
Figure 14B:
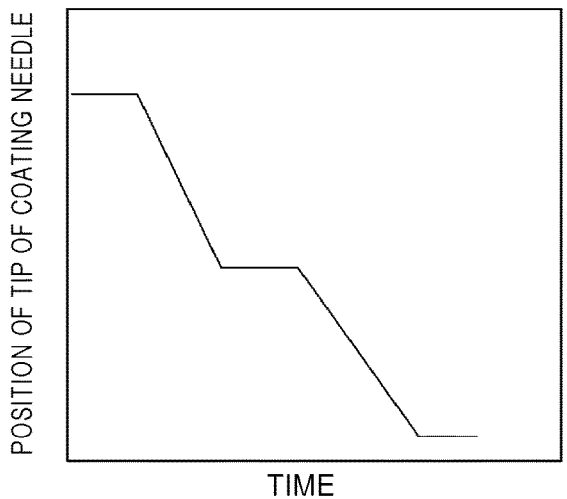
FIGS. 14B and 14C are views illustrating a relationship between time and a position of a tip of the coating needle of the embodiment.
Figure 14C:
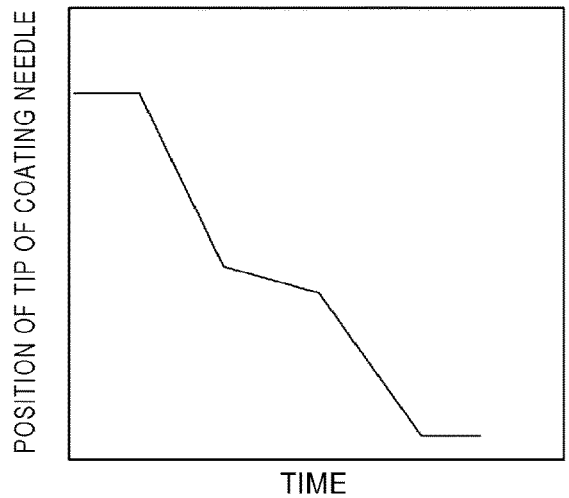

Even if the nozzle needle 1 is not temporarily stopped, the same effect can be expected by reducing the speed from a certain point. FIG. 14A is a view illustrating a relationship between time and a position of the tip of the related coating needle. FIGS. 14B to 14C are views illustrating a relationship between time and a position of the tip of the coating needle of the embodiment. In FIG. 14B, the coating needle 1 is stopped halfway. In FIG. 14C, the coating needle 1 is not stopped but the speed is reduced halfway. For example, even if the coating needle 1 is discharged from the nozzle 2 at a speed of 1 mm/second, proceeds for 5 seconds at a speed of 0.11 mm/second from the position 1 mm away from the nozzle 2, and then is moved at a speed of 1 mm/second, the result is similar to the case of the temporary stop. It is preferably to change the moving speed stepwise halfway. Stopping or speed reducing may only occur in one position. Compared to changing gently as a whole, a discontinuous change is preferable.

Further, reducing the speed of the coating needle 1 (to stop the coating needle 1 at one end) excludes the initial stage and the end stage. That is, the initial stage immediately after the coating needle 1 is protruded from the nozzle 2 and the end stage before and after the coating needle 1 approaches the semiconductor element 4 of an object and applies the adhesive 5 are excluded.

(5) Bonding Step

After the adhesive 5 is applied, the semiconductor element 4 and the protective member 6 are united. Thereafter, the adhesive 5 is cured.

Experiment

Figure 13:
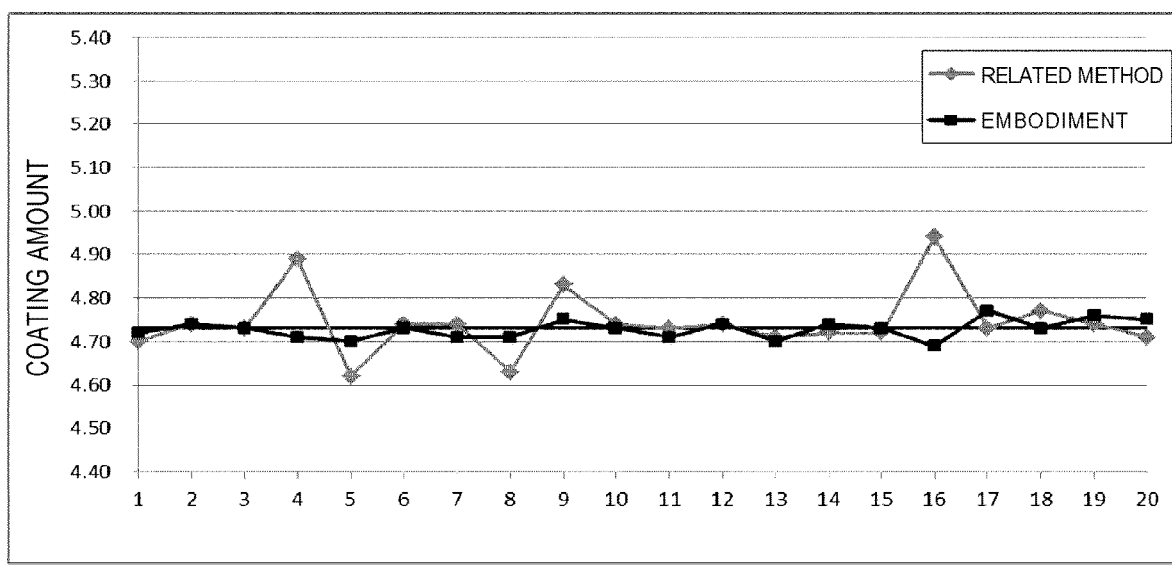
FIG. 13 is a graph obtained by plotting coating amounts in the related method and the embodiment.

FIG. 13 shows a result of plotting a graph obtained by applying the adhesives and plotting coating amounts in the related method and the embodiment. The experiment is performed under the following conditions.

Adhesive: acrylic resin-based about 1000 mPa·s

Inner diameter of nozzle: φ800 μm

Speed of coating needle: 1.75 mm/second

Diameter of coating needle: φ400 μm

Temporarily stopping position: a position of protruding 1 mm from a nozzle

Temporarily stopping time: 1 second

Except that the coating needle is not temporarily stopped in the related method, other conditions are the same.

Since the variations in the coating amount can be significantly reduced, compared to $3\sigma=0.22$ in the related method, $3\sigma$ becomes 0.06 in the embodiment. At least, in the embodiment of this time, $3\sigma$ becomes 0.20 or less. More preferably, $3\sigma$ becomes 0.10 or less.

Compared to the coating method by means of transferring by the related coating needle, by temporarily stopping the lowering operation of the coating needle as described above, it is possible to eliminate the adhesion of the adhesive to the lateral surface of the coating needle and to reduce the variations in the coating amount.

As a Whole

An adhesive widely includes solder paste and a bonding member.

Instead of the semiconductor element 4, as a first member, it is also possible to apply the first member to various kinds of devices. Instead of the protective member 6, except for the cover glass, other devices as a second member can also use various kinds of protective members.

Figure 3:
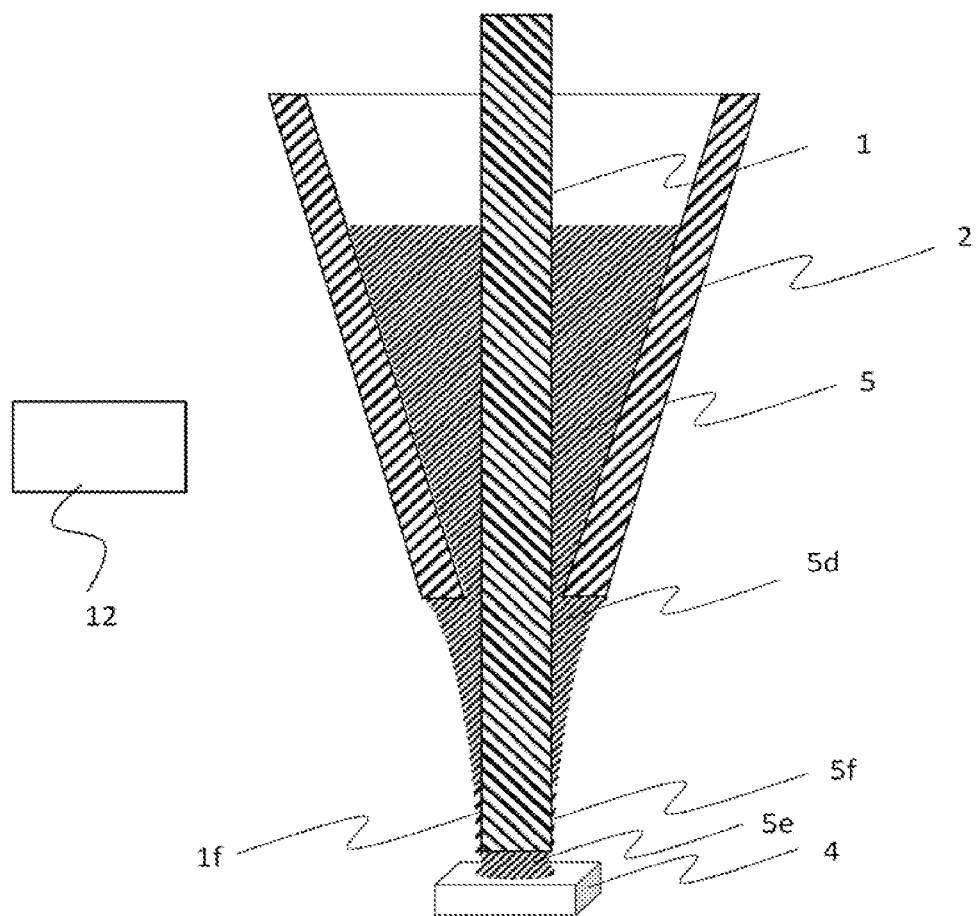
FIG. 3 is a view illustrating a relationship between the adhesive and the coating needle in a transfer of related adhesive coating.
Figure 4A:
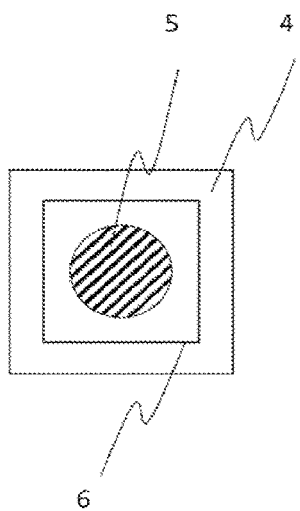
FIGS. 4A to 4C are plan views when the related semiconductor element adheres to a protective member.
Figure 4B:
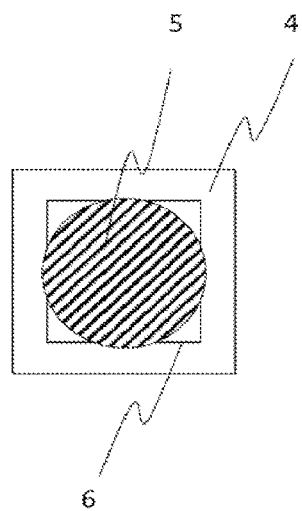
Figure 4C:
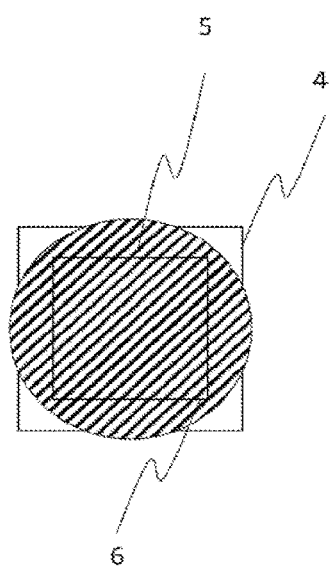
Figure 5:
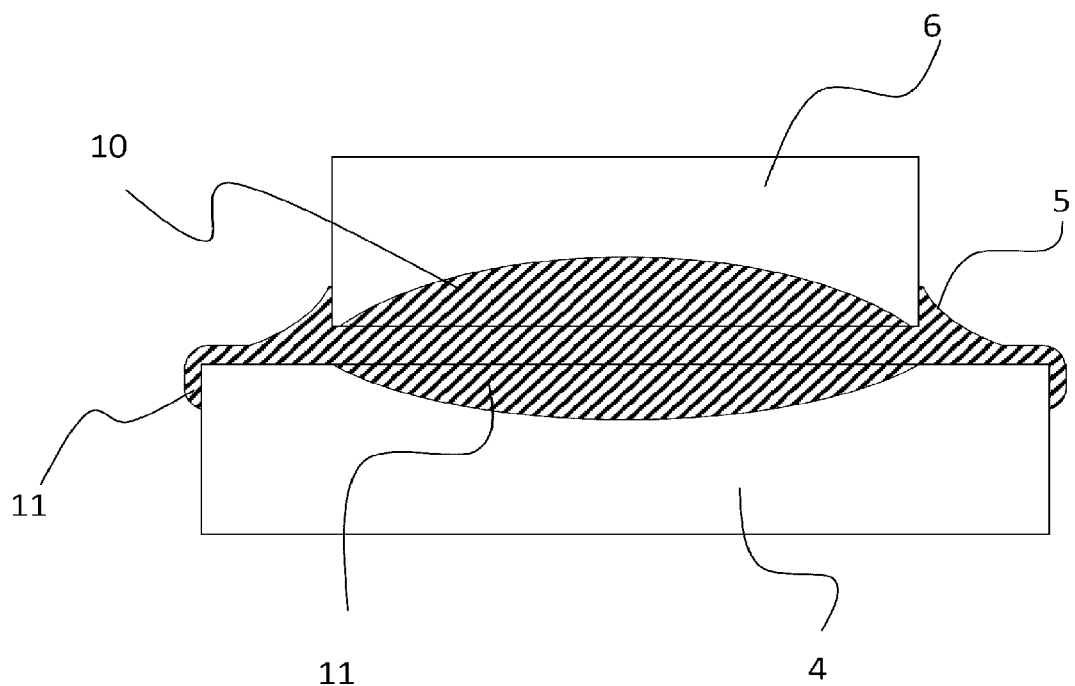
FIG. 5 is a side view of a semiconductor element when a related adhesive coating means is used.

A control such as a control of the coating needle 1 in the apparatus can be performed by a control unit 12 of FIG. 3.

The coating apparatus of the present disclosure has a feature of reducing variations in the coating amount during one point transferring and can be applied widely to applications where members are attached together with high quality. In addition, the semiconductor mounting method and the semiconductor mounting apparatus of the present disclosure are not limited to a semiconductor and can be used in precision components such as optical components.

What is claimed is:

1. A coating method comprising:
discharging a coating needle with an adhesive attached as one lump from a tip to a lateral surface of the coating needle from a nozzle;
separating the one lump of adhesive into adhesive at the tip of the coating needle and adhesive at the lateral surface of the coating needle by further discharging the coating needle after the discharging and changing a moving speed of the coating needle; and
making the adhesive at the tip of the coating needle adhere to a first member by further discharging the coating needle after the separating,
wherein the changing of the moving speed of the coating needle is not a temporary stop, but a reduction in speed to a speed slower than the moving speed of the coating needle immediately after the discharging, and after the separation, the speed of the coating needle is increased again.

2. The coating method according to claim 1,
wherein the speed of the coating needle before and after the separation is the same.

3. The coating method according to claim 1,
wherein the changing of the moving speed of the coating needle occurs when the needle is discharged halfway.

4. A method for manufacturing a component comprising:
the coating method according to claim 1;
adhering the adhesive to the first member; and
bonding a second member from the adhesive on the first member.

* * * * *